United States Patent [19]

Mori

[11] Patent Number: 4,847,497
[45] Date of Patent: Jul. 11, 1989

[54] APPARATUS FOR RECORDING IMAGES PRODUCED BY AN ELECTRON MICROSCOPE

[75] Inventor: Nobufumi Mori, Kanagawa, Japan

[73] Assignee: Fuji Photo Film Co., Ltd., Kanagawa, Japan

[21] Appl. No.: 157,155

[22] Filed: Feb. 11, 1988

Related U.S. Application Data

[63] Continuation of Ser. No. 849,290, Apr. 8, 1986, abandoned.

[30] Foreign Application Priority Data

Apr. 11, 1985 [JP] Japan ................................. 60-77208

[51] Int. Cl.$^4$ ........................ G03B 42/00; G01T 1/00
[52] U.S. Cl. ................. 250/327.2; 250/311; 250/397; 250/484.1
[58] Field of Search ................. 250/327.2 C, 484.1 B, 250/397, 311

[56] References Cited

U.S. PATENT DOCUMENTS

| | | | |
|---|---|---|---|
| 3,529,154 | 9/1970 | Bouwmeester | 250/311 |
| 3,671,742 | 6/1972 | Browning | 250/311 |
| 4,206,349 | 6/1980 | Kamimura | 250/311 |
| 4,258,264 | 3/1981 | Kotera et al. | 250/484.1 |
| 4,276,473 | 6/1981 | Kato et al. | 350/327.2 |
| 4,315,318 | 2/1982 | Kato et al. | 364/515 |
| 4,387,428 | 6/1983 | Ishida et al. | 364/414 |
| 4,485,304 | 11/1984 | Teraoka et al. | 250/327.2 |

FOREIGN PATENT DOCUMENTS

| | | | |
|---|---|---|---|
| 55-47719 | 4/1980 | Japan . | |
| 55-47720 | 4/1980 | Japan . | |
| 11395 | 2/1981 | Japan | 250/327.2 |

Primary Examiner—Janice A. Howell
Assistant Examiner—Constantine Hannaher
Attorney, Agent, or Firm—Gerald J. Ferguson, Jr.

[57] ABSTRACT

Two-dimensional image sensors in the form of stimulable phosphor sheets or thermoluminescent phosphor sheets are supplied from a sensor supply unit to a recorder and exposed, one at a time, in the recorder to an electron beam transmitted through a specimen in an electron microscope, thereby storing the energy of the electron beam carrying a magnified specimen image. The two-dimensional image sensors each storing the electron beam energy are thereafter scanned by stimulating energy, emitting light indicating the stored electron beam energy. The emitted light is converted to an electric signal for display, printing, or temporary storage. Photographic films can also be supplied from a film supply unit to the recorder and exposed to the electron beam. The exposed photographic films are thereafter developed by a known process to reproduce the specimen images thereon.

6 Claims, 2 Drawing Sheets

APPARATUS FOR RECORDING IMAGES PRODUCED BY AN ELECTRON MICROSCOPE

This application is a continuation of Ser. No. 849,290, filed Apr. 8, 1986, now abandoned.

BACKGROUND OF THE INVENTION

1. Field of the Invention

The present invention relates to an apparatus for recording images produced by an electron microscope, and more particularly to an image recording apparatus capable of recording electron microscope images with high sensitivity and of reproducing the recorded electron microscope images in the form of electric signals in order to allow the images to be processed in various ways.

2. Description of the Prior Art

There are known electron microscopes for obtaining a magnified image of a specimen by deflecting with an electric or magnetic field a beam of electrons transmitted through the specimen. As is well known, the electron beam that has passed through the specimen forms a diffraction pattern of the specimen on the rear focal plane of the objective lens, and the diffracted beams interfere with each other again to produce the magnified image of the specimen. The magnified specimen image ca be observed as a magnified specimen image (transmission image) by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified transmission image or the diffraction pattern may be produced selectively as desired by adjusting the focal length of the intermediate lens.

The magnified image or the diffraction pattern (hereinafter referred to collectively as a "transmitted electron-beam image") may be observed in different manners. For example, one general practice has been to place a photographic film on the image formation plane of the projector lens for exposure to the transmitted electron-beam image. According to another design, an image intensifier is employed to amplify the transmitted electron-beam image for projection. The use of photographic films is however disadvantageous in that their sensitivity to electron beams is low and the process of developing the films is complex. The image intensifier also has drawbacks in that the images produced thereby have poor sharpness and are likely to become distorted.

Transmitted electron-beam images are often processed to make them more easier to see. Specifically, the transmitted electron-beam images are subjected to various signal processing modes such as tone processing, frequency emphasis, density processing, subtractive processing, and additive processing. The images are also processed to reconstruct three-dimensional images by Fourier analysis, digitize the images, and measure particle diameters. The diffraction patterns are also processed to analyze crystal information and find lattice constants, dislocations, and lattice defects. For such image and diffraction pattern processing, it has been customary to convert the electron microscope image on a developed photographic film into an electric signal with a microphotometer, convert the electric signal into a digital signal, and then process the digital signal with a computer. This process has proven unsatisfactory since it is quite complex.

SUMMARY OF THE INVENTION

In view of the aforesaid problems of the prior electron microscope image recording apparatus, it is an object of the present invention to provide an image recording apparatus capable of recording and reproducing electron microscope images with high sensitivity and quality, and also of recording electron microscope images in a manner enabling direct production of electric signals representing the images at the subsequent stage of image reproduction.

According to the present invention, there is provided an apparatus for recording an image produced by an electron microscope, comprising a film supply unit for storing a photographic film to be exposed to an electron beam, a film receiving unit for storing the photographic film that has been exposed to the electron beam, a sensor supply unit for storing a two-dimensional image sensor to store the energy of the electron beam thereon, a sensor receiving unit for storing the two-dimensional image sensor which has stored the energy of the electron beam, a recorder for selectively holding the photographic film and the two-dimensional image sensor in the image-formation plane of the electron microscope and for exposing the photographic film or the two-dimensional image sensor to the electron beam that has passed through a specimen in the electron microscope, film supply means for supplying the photographic film from the film supply unit to the recorder, film discharge means for delivering the photographic film from the recorder into the film receiving unit after the photographic film has been exposed to the electron beam, sensor supply means for supplying the two-dimensional image sensor from the sensor supply unit to the recorder, and sensor discharge means for delivering the two-dimensional sensor from the recorder into the sensor receiving unit after the two-dimensional image sensor has been exposed to the electron beam.

The two-dimensional image sensor is made of a material capable of temporarily storing at least part of the electron beam energy. When stimulating energy is subsequently applied to the two-dimensional image sensor which has stored the electron beam energy, the two-dimensional image sensor can discharge at least part of the stored energy in a detectable form such as light, electricity, or sound.

The two-dimensional image sensor preferably comprises a stimulable phosphor sheet as disclosed in U.S. Pat. Nos. 4,258,264, 4,276,473, and 4,315,318, Japanese Unexamined Patent Publication No. 56(1981)-11395, and U.S. Pat. No. 4,387,428, for example. Certain phosphors, when exposed to a radiation such as an electron beam, store a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor, and the stimulable phosphor sheet is generally composed of a support and a stimulable phosphor layer disposed on the support. The stimulable phosphor layer may be formed by dispersing the stimulable phosphor in a suitable binder. However, the stimulable phosphor layer may itself be a stimulable phosphor sheet if it is self-supporting. Examples of stimulable phosphors which can form the stimulable phosphor sheet are described in Japanese Patent Application No. 59(1984)-214680 (U.S. Ser. No. 786,080).

The two-dimensional sensor may also be in the form of a thermoluminescent phosphor sheet as disclosed in Japanese Patent Publication Nos. 55(1980)-47719 and 55(1980)-47720, for example. The thermoluminescent phosphor sheet emits stored radiation energy as thermoluminescence when heat is applied to the sheet. The thermoluminescent phosphor sheet may be constructed in the same manner as the stimulable phosphor sheet.

The two-dimensional image sensor, either a stimulable phosphor sheet or a thermoluminescent phosphor sheet, is placed in the image-formation plane, and exposed to the electron beam that has been transmitted through the specimen to store the transmitted electron-beam image of the specimen thereon with a high resolution. The two-dimensional image sensor is then scanned by stimulating light or a sweeping heat beam to emit light that is photoelectrically read, i.e., converted to an electric signal representative of the transmitted electron-beam image. The electric signal thus produced is employed to display the electron microscope image on a display such as a CRT or record the image permanently as in hard copy form. The electric image signal may alternatively be temporarily stored on a recording medium such for example as magnetic tape or magnetic disc. The electron microscope image can easily be processed in various ways such as tone processing, frequency emphasis, etc., by using the electric image signal. Diffraction pattern processing, reconstruction of a three-dimensional image, and image analysis such as image digitization can also be performed more simply and quickly than heretofore by applying the electric image signal to a computer.

The two-dimensional image sensor is recyclically usable by applying erasing light or heat thereto. Therefore, the electron microscope image can be recorded more economically on the two-dimensional image sensor than in the normal silver halide photographic process.

The electron microscope image can also be recorded on the photographic film. Though the photographic film is relatively low in sensitivity, it can record the electron microscope image with a higher resolution than is possible with the two-dimensional image sensor. The electron microscope image should therefore be recorded on the photographic film when it is required that the image be reproduced with a greater resolution.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
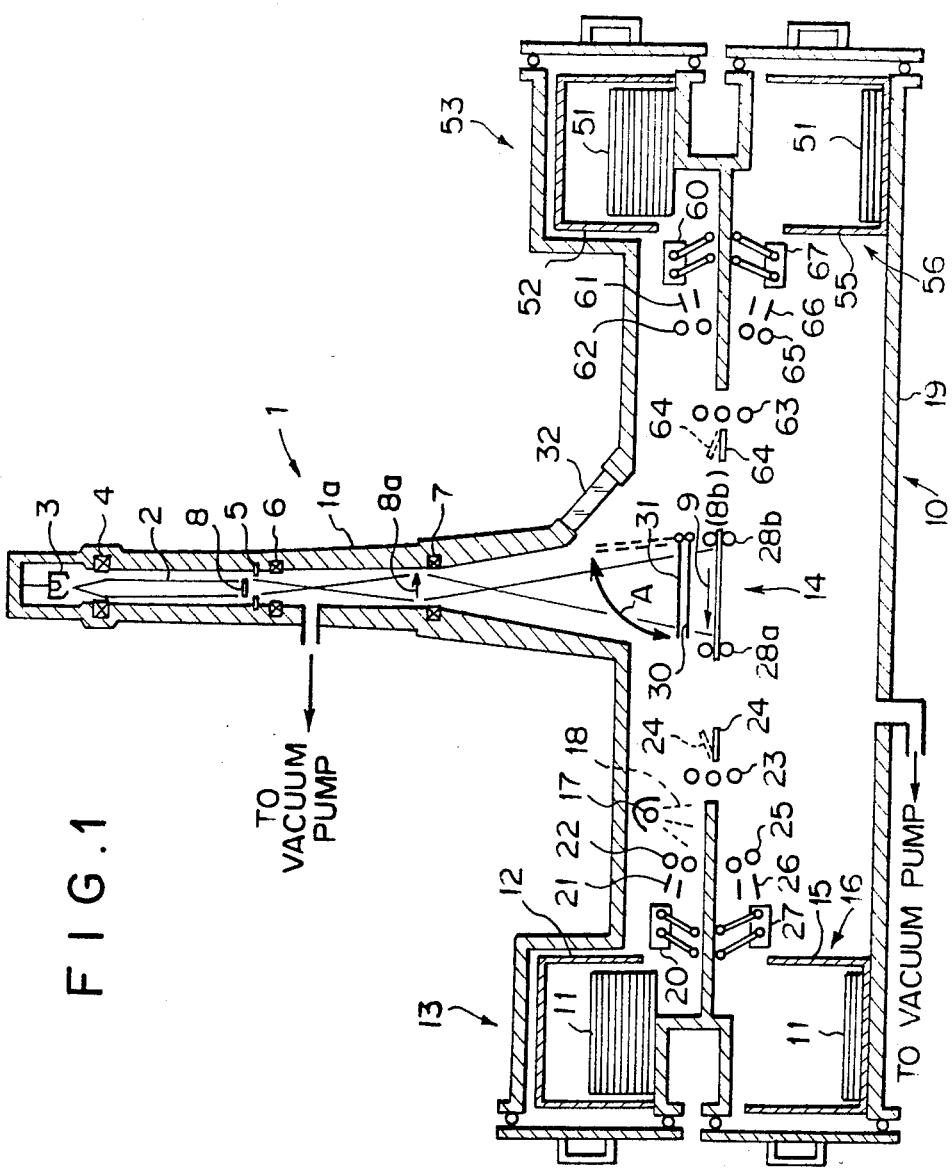
FIG. 1 is a vertical cross-sectional view of an apparatus for recording and reproducing images produced by an electron microscope according to an embodiment of the present invention.

Like or corresponding parts are denoted by like or corresponding reference characters throughout the several views.

FIG. 1 shows an apparatus for recording and reproducing electron microscope images according to an embodiment of the present invention. An electron microscope 1 has a tubular lens barrel 1a housing an electron gun 3 for emitting an electron beam 2 at a uniform speed, at least one convergent lens 4 comprising a magnetic lens or an electrostatic lens for converging the electron beam 2 toward a specimen 8, a specimen support 5, an objective lens 6 identical to the convergent lens 4, and a projector lens 7. The electron beam 2 that has passed through the specimen 8 placed on the specimen support 5 is deflected by the objective lens 6 to form a magnified transmission image 8a of the specimen 8. The magnified transmission image 8a is focused by the projector lens 7 as an image 8b on an image formation plane 9.

The apparatus for recording and reproducing electron microscope images, which is generally denoted at 10, includes a casing 19 joined to and disposed below the lens barrel 1a. The apparatus 10 comprises a sensor supply unit 13 disposed in the lefthand end (as shown) of the casing 19 and housing a magazine 12 containing a number of two-dimensional image sensors 11 in the form of stimulable phosphor sheets a sensor receiving unit 16 disposed in the casing 19 underneath the sensor supply unit 13 and housing a magazine 15 identical to the magazine 12, a recorder 14 positioned horizontally centrally to the casing 19 and including the image-formation plane 9, and an erasing light source 17 disposed in the casing 19 between the recorder 14 and the sensor supply unit 13.

The stimulable phosphor sheets 11 in the magazine 12 are taken, one at a time, from the magazine 12 by a sheet delivery arm 20 which grips an end of the stimulable phosphor sheet 11. The stimulable phosphor sheet 11 thus brought out of the magazine 12 is moved by the sheet delivery arm 20 between two guide plates 21, and then fed over a guide plate 24 held in the horizontal solid-line position into the recorder 14 by sheet feed rollers 22 and feed/discharge rollers 23, 28a, 28b. After an electron microscope image has been recorded on the stimulable phosphor sheet 11 in the recorder 14, the rotation of the feed/discharge rollers 28a, 28b is reversed and the guide plate 24 is tilted upward to the dotted-line position. The stimulable phosphor sheet 11 is caused by the feed/discharge rollers 28a, 28b, 23 and sheet discharge rollers 25 to travel below the guide plate 24 between two guide plates 26, and is then delivered by a sheet discharge arm 27, identical to the sheet delivery arm 20, into the magazine 15 in the sensor receiving unit 16.

The apparatus 10 also comprises a film supply unit 53 disposed in the righthand end (as shown) of the casing 19 and housing a magazine 52 containing a number of photographic films 51 of the type which has heretofore been used for recording electron microscope images, and a film receiving unit 56 disposed in the casing 19 underneath the film supply unit 53 and housing a magazine 55 identical to the magazine 52.

The photographic films 51 in the magazine 52 are taken, one at a time, from the magazine 52 by a film delivery arm 60, identical to the sheet delivery arm 20, which grips an end of the photographic film 51. The photographic film 51 brought out of the magazine 52 is moved by the sheet delivery arm 60 between two guide plates 61, and then fed over a guide plate 64 held in the horizontal solid-line position into the recorder 14 by film feed rollers 62 and feed/discharge rollers 63 and the feed/discharge rollers 28a, 28b. After an electron microscope image has been recorded on the photographic film 51 in the recorder 14, the rotation of the feed/discharge rollers 28a, 28b is reversed and the guide plate 64 is tilted upward to the dotted-line position. The photographic film 51 is caused by the feed/discharge rollers 28a, 28b, 23 and film discharge rollers 65 to travel below the guide plate 64 between two guide plates 66, and is then delivered by a film discharge arm 67, identical to the sheet discharge arm 27, into the magazine 55 in the film receiving unit 56.

Between the tubular lens barrel 1a and the recorder 14, there are disposed a shutter 30 and a phosphor screen 31 which are angularly movable in the direction of the arrow A by levers (not shown). An observation window 32 made of lead glass, for example, is fitted in the wall of the lens barrel 1a above the phosphor screen 31.

The interiors of the lens barrel 1a and the casing 19 are kept under vacuum by a known vacuum pump while the electron microscope 1 is in operation. The spaces in the lens barrel 1a and the casing 19 are isolated from each other by a known shield (not shown) positioned between the lens barrel 1a and the casing 19. Therefore, the interior of the lens barrel 1a can be maintained under vacuum even when the interior of the casing 19 is in communication with the atmosphere at the time of loading the magazine 12 or 52 and taking out the magazine 15 or 55.

For recording electron microscope images, the sensor supply unit 13 is loaded with the magazine 12 containing a number of stimulable phosphor sheets 11 and the sensor receiving unit 16 is loaded with the magazine 15 which is empty. The shutter 30 and the phosphor screen 31 are held in a horizontal position (as shown) to shield the recorder 14 from the electron beam 2. The sheet delivery arm 20 is operated and the rollers 22, 23, 28a, 28b are rotated to supply the lowermost stimulable phosphor sheet 11 from the magazine 12 to the recorder 14. While the stimulable phosphor sheet 11 is being fed along to the recorder 14, the erasing light source 17 is energized to erase any remanent radiation energy from the sheet 11. When the stimulable phosphor sheet 11 reaches the image-formation plane 9, the rollers 28a, 28b are stopped to hold the sheet 11 in the image-formation plane 9.

Since the phosphor screen 31 emits light by being exposed to the electron beam 2, the magnified transmission image 8b carried by the electron beam 2 can be viewed by the operator through the observation window 32. After determining the magnification and field of view of the magnified transmission image 8b, the operator turns the levers to lift the shutter 30 and the phosphor screen 31 to the dotted-line position out of the path of the electron beam 2. The electron beam 2 now impinges upon the stimulable phosphor sheet 11 in the recorder 14, and the stimulable phosphor sheet 11 stores the electron beam energy representing the magnified transmission image 8b.

After the stimulable phosphor sheet 11 has been exposed to the electron beam 2, the shutter 30 is lowered to the horizontal position. The stimulable phosphor sheet 1 that has recorded the magnified transmission image 8b is then stored in the magazine 15 by the rollers 23, 28a, 28b, 25 and the sheet discharge arm 27.

The above process is repeated until the magazine 15 is fully loaded with the recorded stimulable phosphor sheets 11. Upon completion of one recording sequence, the magazine 15 is removed from the sensor receiving unit 16, and the retrieved stimulable phosphor sheets 11 are then processed by an image reader to read the recorded electron microscope images therefrom.

Figure 2:
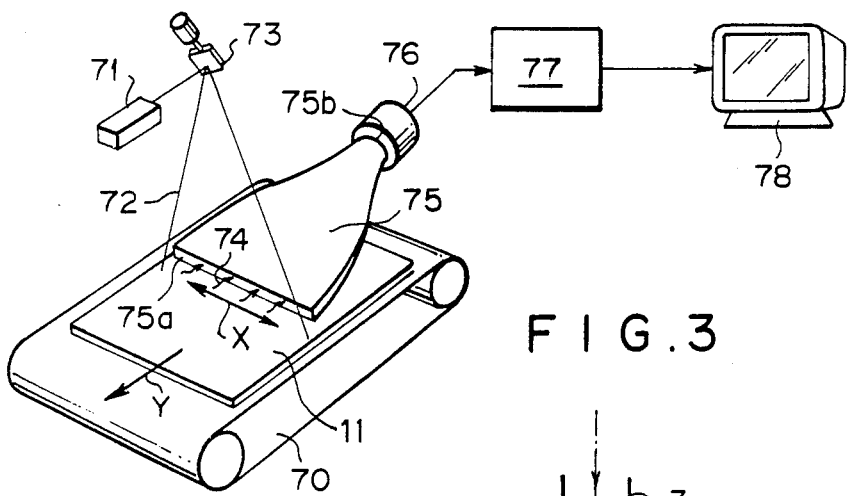
FIG. 2 is a perspective view of a device for reading out an electron microscope image that has been recorded on a stimulable phosphor sheet by the apparatus of the invention.

FIG. 2 shows such an image reader by way of example. The image reader includes a sheet feeder 70 comprising an endless belt, for example, for placing the stimulable phosphor sheet 11 thereon The stimulable phosphor sheet 11 is scanned in the direction of the arrow X (main scanning) by a stimulating light beam 72 emitted from a stimulating light source 71 such as a He-Ne laser tube or the like and deflected by a galvanometer mirror 73, while at the same time the stimulable phosphor sheet 11 is moved by the sheet feeder 70 in the direction of the arrow Y (auxiliary scanning). Therefore, the stimulable phosphor sheet 11 is exposed over its entire surface to the stimulating light beam 72, thereby emitting light 74 (stimulated emission) of a level commensurate with the electron beam energy stored on the stimulable phosphor sheet 11. The emitted light 74 enters a light guide 75 through its entrance end 75a and travels through the light guide 75 through total reflection therein until the light 74 leaves the light guide 75 through its exit end 75b. The light 74 is then detected by a light detector 76 such as a photomultiplier coupled to the exit end 75b so that the amount of the light 74 can be read photoelectrically. Therefore, an electric signal produced from the light detector 76 is indicative of the level of the electron beam energy stored on the stimulable phosphor sheet 11. The electric signal from the light detector 76 is applied to an image processing circuit 77 in which it is subjected to the required image processing, and the processed electric signal is impressed on an image reproducer 78. The image reproducer 78 may comprise a display such as a CRT or a recording device for optically scanning a photosensitive film to record an image thereon. The image reproducer 78 thus reproduces the magnified transmission image 8b carried by the light 74 emitted from the stimulable phosphor sheet 11. Alternatively, the signal from the image processing circuit 77 may be temporarily recorded on a recording medium such as magnetic tape or magnetic disc.

For recording an electron microscope image on a photographic film 51, the magazine 52 containing a number of photographic films 51 is loaded in the film supply unit 53, and the magazine 52 that is empty is loaded in the film receiving unit 56. The lowermost photographic film 51 is fed from the magazine 52 by the film delivery arm 60 and the rollers 62, 63, 28a, 28b into the recorder 14, and is held in the image-formation plane 9 by stopping the rollers 28a, 28b. The photographic film 51 is exposed to the electron beam 2 in the same manner as the exposure of the stimulable phosphor sheet 11 to the electron beam 2. The exposed photographic film 51 is stored in the magazine 55 by the rollers 28a, 28b, 63, 65 and the film discharge arm 67.

The photographic films 51 in the magazine 52 are successively exposed and stored in the magazine 55. After one recording sequence has been finished, the magazine 55 is removed from the film receiving unit 56, and the exposed photographic films 51 are developed in the conventional photographic process to produce photographic images of the magnified transmission images 8b as hard copies.

The image recorded on the stimulable phosphor sheet 11 may be read out while it is under vacuum. Specifically, the stimulable phosphor sheet 11 may be scanned with the stimulating light beam and the light emitted from the stimulable phosphor sheet 11 may be detected when the sheet is positioned between the recorder 14 and the sensor receiving unit 15. For further details, reference should be made to U.S. patent application No. 754,996.

Figure 3:
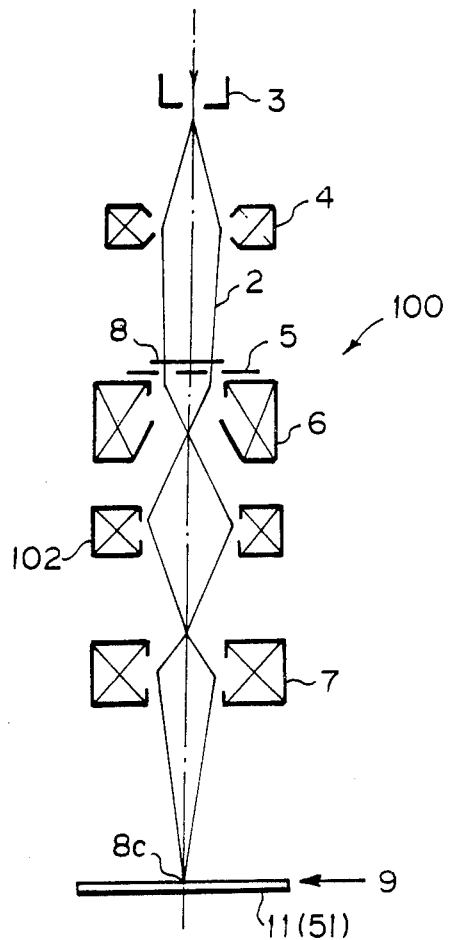
FIG. 3 is a schematic view of an electron microscope of another embodiment which can be employed in the apparatus of the present invention.

The principles of the present invention can be employed for recording and reproducing the diffraction pattern of a specimen. FIG. 3 is an explanatory view of another electron microscope used for recording and reproducing such a diffraction pattern 8c of the specimen 8. The electron microscope, generally denoted at 100, has an intermediate lens 102 disposed between the objective lens 6 and the projector lens 7. The diffraction pattern 8c of the specimen 8, which is formed on the rear focal plane of the objective lens 7, is magnified by the intermediate lens 102 and the projector lens 7 with their focal points on the rear focal plane of the objective lens 7 and is projected onto the image-formation plane 9. By placing the stimulable phosphor sheet 11 or the photographic film 51 in the image-formation plane 9, the magnified image of the diffraction pattern 8c can be recorded by the electron beam 2 on the stimulable phosphor sheet 11 or the photographic film 51. The diffraction pattern 8c recorded on the stimulable phosphor sheet 11 can be read in the same manner as described with reference to FIG. 2, and the read image can be displayed on the CRT or printed as a hard copy. The diffraction pattern 8c recorded on the photographic film 51 can be developed in the known manner.

The stimulable phosphor sheet may comprise a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Publication No. 55(1980)-47720.

Although certain preferred embodiments have been shown and described, it should be understood that many changes and modifications ma be made therein without departing from the scope of the appended claims.

I claim:

1. An apparatus for recording an electron beam image produced by an electron microscope, comprising:
   (i) a film supply unit for storing a photographic film to be exposed to the electron beam image;
   (ii) a film receiving unit for storing said photographic film that has been exposed to the electron beam image;
   (iii) a sensor supply unit for storing a two-dimensional image sensor to store the energy of the electron beam image thereon, said two-dimensional sensor being a stimulable phosphor sheet where the sensitivity of the stimulable phosphor sheet to said electron beam is greater than that of said photographic film such that a lower amount of the electron beam can be used to minimize damage to a specimen in the electron microscope and where, upon exposure to stimulating light, the stored energy of the electron beam image is released as light to be photoelectrically detected;
   (iv) a sensor receiving unit for storing said two-dimensional image sensor which has stored the energy of the electron beam image;
   (v) a recorder for selectively holding said photographic film and said two-dimensional image sensor in the image-formation plane of the electron microscope and for exposing said photographic film or said two-dimensional image sensor to the electron beam that has passed through the specimen in the electron microscope;
   (vi) film supply means for supplying said photographic film from said film supply unit to said recorder;
   (vii) film discharge means for delivering said photographic film from said recorder into said film receiving unit after the photographic film has been exposed to the electron beam;
   (viii) sensor supply means for supplying said two-dimensional image sensor from said sensor supply unit to said recorder; and
   (ix) sensor discharge means for delivering said two-dimensional sensor from said recorder into said sensor receiving unit after the two-dimensional image sensor has been exposed to the electron beam.

2. An apparatus according to claim 1, including a casing, said sensor supply and receiving units being disposed in one end of said casing, and said film supply and receiving units being disposed in the opposite end of said casing.

3. An apparatus according to claim 2, wherein said sensor receiving unit is disposed underneath said sensor supply unit, and said film receiving unit is disposed underneath said film supply unit.

4. An apparatus according to claim 2, wherein said recorder is disposed substantially centrally in said casing between said sensor supply and receiving units and said film supply and receiving units.

5. An apparatus according to claim 4, wherein said film supply means comprises rollers disposed between said recorder and said film supply unit and said film discharge means comprises rollers disposed between said recorder and said film receiving means, and wherein said sensor supply means comprises rollers disposed between said recorder and said sensor supply unit and said sensor discharge means comprises rollers disposed between said recorder and said sensor receiving means.

6. An apparatus according to claim 1, wherein said sensor supply means includes erasing means for erasing any remanent radiation energy from said two-dimensional image sensor.

* * * * *